(12) United States Patent
Kim et al.

(10) Patent No.: US 10,488,717 B2
(45) Date of Patent: Nov. 26, 2019

(54) DISPLAY APPARATUS, METHOD FOR MANUFACTURING THE SAME, AND MULTI DISPLAY APPARATUS

(71) Applicant: SAMSUNG DISPLAY CO., LTD., Yongin-si, Gyeonggi-do (KR)

(72) Inventors: Kwihyun Kim, Yongin-si (KR); Jongjae Lee, Hwaseong-si (KR); Junghwan Hwang, Cheonan-si (KR); Jongdo Keum, Suwon-si (KR); Yoonsik Park, Yongin-si (KR); Hongmin Yoon, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 2 days.

(21) Appl. No.: 15/381,138

(22) Filed: Dec. 16, 2016

(65) Prior Publication Data

US 2017/0343868 A1    Nov. 30, 2017

(30) Foreign Application Priority Data

May 24, 2016    (KR) .................. 10-2016-0063660

(51) Int. Cl.
| | | |
|---|---|---|
| G02F 1/1343 | (2006.01) | |
| G02F 1/1333 | (2006.01) | |
| G02F 1/1339 | (2006.01) | |
| G02F 1/1362 | (2006.01) | |
| G02F 1/1368 | (2006.01) | |

(Continued)

(52) U.S. Cl.
CPC ...... *G02F 1/134336* (2013.01); *G02F 1/1339* (2013.01); *G02F 1/1368* (2013.01); *G02F 1/133305* (2013.01); *G02F 1/136286* (2013.01); *G09G 3/3674* (2013.01); *G09G 3/3685* (2013.01); *H01L 27/1255* (2013.01); *H01L 29/78666* (2013.01); *G02F 2001/133302* (2013.01); *G02F 2201/121* (2013.01);

(Continued)

(58) Field of Classification Search
CPC ... G02F 1/1345–13454; G02F 1/13458; G02F 1/133305; G02F 1/13336; G02F 2001/13456; G02F 2001/133302; H01L 27/3293; H01L 27/0097; G06F 1/1641
See application file for complete search history.

(56) References Cited

U.S. PATENT DOCUMENTS

| | | | |
|---|---|---|---|
| 9,214,640 B2 | 12/2015 | Lee et al. | |
| 2012/0146886 A1* | 6/2012 | Minami | H01L 27/3276 345/80 |

(Continued)

FOREIGN PATENT DOCUMENTS

KR    10-1431752 B1    8/2014

*Primary Examiner* — Maricelio Santiago
(74) *Attorney, Agent, or Firm* — Kile Park Reed & Houtteman PLLC (57) ABSTRACT

A display apparatus includes a first substrate, a first dummy substrate on the first substrate, and a second dummy substrate extending from the first dummy substrate and bent. The second dummy substrate is on different side surfaces of the first substrate in a first direction. The display apparatus also includes a plurality of pixels on the first dummy substrate, a gate driver on the second dummy substrate and connected to the pixels, and a data driver connected to one side of the first dummy substrate in a second direction crossing the first direction and connected to the pixels.

18 Claims, 10 Drawing Sheets

(51) Int. Cl.
  *G09G 3/36* (2006.01)
  *H01L 27/12* (2006.01)
  *H01L 29/786* (2006.01)

(52) U.S. Cl.
  CPC .................. *G02F 2201/123* (2013.01); *G09G 2300/0426* (2013.01); *G09G 2380/02* (2013.01)

(56) References Cited

U.S. PATENT DOCUMENTS

| | | | |
|---|---|---|---|
| 2013/0076268 A1* | 3/2013 | Choi | H01L 51/0097 315/312 |
| 2013/0335660 A1* | 12/2013 | Jung | G02F 1/1345 349/42 |
| 2014/0049742 A1* | 2/2014 | Misono | G02F 1/1339 349/153 |
| 2014/0070218 A1* | 3/2014 | Kim | H01L 27/32 257/59 |
| 2014/0092338 A1* | 4/2014 | Miyazaki | G02F 1/13452 349/58 |
| 2014/0104528 A1* | 4/2014 | Jung | G02F 1/133305 349/43 |
| 2014/0306941 A1* | 10/2014 | Kim | H04M 1/0268 345/204 |
| 2015/0014686 A1 | 1/2015 | Lv | |
| 2015/0173198 A1 | 6/2015 | Jung et al. | |
| 2016/0014882 A1* | 1/2016 | Jongman | G02F 1/13452 361/749 |
| 2016/0111040 A1* | 4/2016 | Kim | G02F 1/13454 345/698 |

\* cited by examiner

DISPLAY APPARATUS, METHOD FOR MANUFACTURING THE SAME, AND MULTI DISPLAY APPARATUS

CROSS-REFERENCE TO RELATED APPLICATION

Korean Patent Application No. 10-2016-0063660, filed on May 24, 2016, and entitled, "Display Apparatus, Method for Manufacturing the Same, and Multi Display Apparatus," is incorporated by reference herein in its entirety.

BACKGROUND

1. Field

One or more embodiments described herein related to a display apparatus, a method for manufacturing a display apparatus, and a multi display apparatus.

2. Description of the Related Art

A display panel generates images based on gate signals and data voltages. A gate driver for generating the gate signals is located in a non-display area of the display panel. In order to accommodate the gate driver, the size of the non-display area must be increased. Consequently, a bezel area of a display apparatus incorporating the display panel is increased.

SUMMARY

In accordance with one or more embodiments, a display apparatus includes a first substrate; a first dummy substrate on the first substrate; a second dummy substrate extending from the first dummy substrate and bent, the second dummy substrate on different side surfaces of the first substrate in a first direction; a plurality of pixels on the first dummy substrate; a gate driver on the second dummy substrate and connected to the pixels; and a data driver connected to one side of the first dummy substrate in a second direction crossing the first direction and connected to the pixels. Each of the first and second dummy substrates may include a flexible substrate. The first substrate may be a glass substrate.

The display apparatus may include a backlight, under the first substrate, to generate light. The second dummy substrate may be on different side surfaces of the first substrate in the first direction and on different side surfaces of the backlight in the first direction. The display apparatus may include a plurality of gate lines on the first dummy substrate, extending in the first direction, and connected to the pixels and the gate driver; and a plurality of data lines on the first dummy substrate, extending in the second direction, and connected to the pixels and the data driver.

The gate driver may include a first gate driver connected to odd-numbered gate lines of the gate lines; and a second gate driver connected to even-numbered gate lines of the gate lines. The first gate driver may be on the second dummy substrate disposed on one side surface of the first substrate and one side surface of the backlight in the first direction, and the second gate driver may be on the second dummy substrate disposed on another side surface of the first substrate and another side surface of the backlight in the first direction.

An area of a plane of the first substrate may include a display area including the pixels; and a non-display area adjacent to the display area. The display apparatus may include a second substrate facing the first dummy substrate with the pixels therebetween. The display apparatus may include a seal on a predetermined area of the non-display area and adjacent to the display area, wherein the seal is between the first dummy substrate and the second substrate and bonds the first dummy substrate to the second substrate. The gate driver may be on the second dummy substrate, and the gate driver may include an amorphous silicon thin film transistor gate driving circuit, an oxide silicon thin film transistor gate driving circuit, or a polysilicon thin film transistor gate driving circuit.

In accordance with one or more other embodiments, a method for manufacturing a display apparatus includes providing a dummy substrate including a first dummy substrate and a second dummy substrate on different sides of the first dummy substrate on a first substrate; providing a pixel layer on the first dummy substrate and a gate driver connected to the pixel layer on the second dummy substrate; connecting the data driver, connected to the pixel layer, to one side of the first substrate in a second direction crossing the first direction; providing a second substrate to face the first dummy substrate with the pixel layer therebetween; providing an image display layer between the dummy substrate and the second substrate; separating the first substrate along a line which overlaps a boundary between the first dummy substrate and the second dummy substrate to extend in the second direction; removing the first substrate on a lower portion of the second dummy substrate; and bending the second dummy substrate to provide the second dummy substrate on different side surfaces of the first substrate in the first direction.

The method may include providing a seal on the first dummy substrate adjacent to the pixel layer, the seal adjacent to the boundary between the first dummy substrate and the second dummy substrate and a side surface of the second substrate in the first direction; and bonding the first dummy substrate to the second substrate using the sealing. The image display layer may include a liquid crystal layer, each of the first and the second substrates may include a glass substrate, and the dummy substrate may include a flexible substrate. The method may include providing a backlight to generate light below the first substrate, wherein the second dummy substrate is on different side surfaces of the first substrate in the first direction and on different side surfaces of the backlight in the first direction.

In accordance with one or more other embodiments, a multi display apparatus which includes a plurality of display panels arranged in a matrix form; a plurality of gate drivers adjacent to different side surfaces of the display panels in a first direction; a plurality of data drivers connected to one side of each of the display panels in a second direction crossing the first direction; and a buffer between the display panels which are adjacent to each other in the first direction, wherein each of the display panels includes: a first substrate; a first dummy substrate on the first substrate; a second dummy substrate extending from the first dummy substrate and bent, the second dummy substrate on different side surfaces of the first substrate in the first direction; a plurality of pixels on the first dummy substrate; and a second substrate facing the first dummy substrate with the pixels therebetween, wherein the gate driver is on the second dummy substrate and connected to the pixels, and wherein the data driver is connected to one side of the first dummy substrate in the second direction and connected to the pixels.

The display panels may be arranged in a N×M matrix form, where N≥1 and M≥2; the gate drivers between side surfaces of the first substrate of the display panels facing each other in the first direction may contact each other, side surfaces of the display panels on which the data drivers are not disposed in the second direction may contact each other, and the buffer may be above the gate drivers. A an area of a plane of the display panel may include a display area including the pixels; and a non-display area adjacent to the display area, wherein an area between the display areas adjacent to each other in the first direction has a width of about 0.4 mm to about 1.0 mm.

In accordance with one or more other embodiments, a display apparatus includes a first substrate including a non-display area adjacent to a display area; a first dummy substrate on the first substrate on a predetermined area of the non-display area; a second dummy substrate extending from the first dummy substrate and bent, the second dummy substrate on different side surfaces of the first substrate; a plurality of pixels on the first substrate on the display area; a gate driver on the second dummy substrate and connected to the pixels; a data driver connected to one side of the first substrate in a second direction crossing the first direction and connected to the pixels; a second substrate facing the first dummy substrate with the pixels therebetween; and a seal between the first dummy substrate and the second substrate on a predetermined area of the non-display area to surround the display area, the seal bonding the first dummy substrate to the second substrate.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element or layer, there are no intervening elements or layers present. As used herein, the term "and/or" includes any and all combinations of one or more of the associated listed items.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
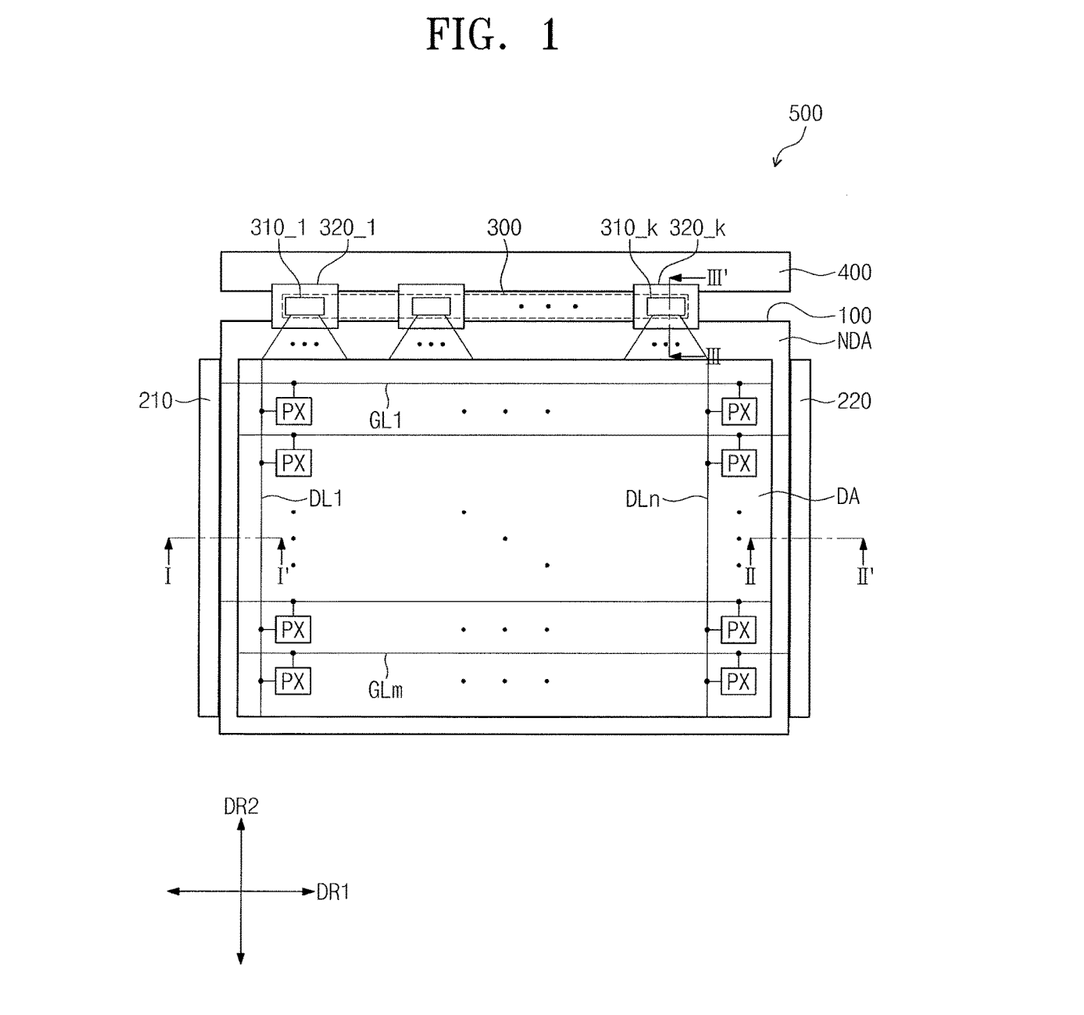
FIG. 1 illustrates an embodiment of a display apparatus.

FIG. 1 illustrates an embodiment of a display apparatus 500 which includes a display panel 100, gate drivers 210 and 220, a data driver 300, and a printed circuit board 400. The display panel 100 may be a liquid crystal display panel including a liquid crystal layer. In another embodiment, the display panel 100 may be another type of display panel, e.g., an electrophoretic display panel including an electrophoretic layer or an electrowetting display panel including an electrowetting layer. The liquid crystal layer, the electrophoretic layer, and the electrowetting layer may be correspond to an image display layer.

The display panel 100 includes a plurality of gate lines GL1 to GLm, a plurality of data lines DL1 to DLn, and a plurality of pixels PX, where m and n are integers greater than 0. The gate lines GL1 to GLm and the data lines DL1 to DLn are insulated from and cross each other. The gate lines GL1 to GLm extend in a first direction DR1 and are connected to the gate drivers 210 and 220. The data lines DL1 to DLn extend in a second direction DR2 crossing the first direction DR1 and are connected to the data driver 300. For example, the first direction DR1 may be a row direction and the second direction DR2 may be a column direction, or vice versa.

The display panel 100 may include a plane having a display area DA to display an image and a non-display area NDA surrounding the display area DA and which does not display an image.

The pixels PX are on the display area DA and connected to the gate lines GL1 to GLm and the data lines DL1 to DLn. The pixels PX are on areas partitioned by the gate lines GL1 to GLm and the data lines DL1 to DLn, which cross each other. Thus, the pixels PX are arranged in a matrix including m rows and n column. Each of the pixels PX may emit light of one of a predetermined number of colors, e.g., red, green, blue, and white colors. In another embodiment, the pixels may emit light of a different combination of colors, e.g., yellow, cyan, and magenta.

The gate drivers 210 and 220 include a first gate driver 210 adjacent to one side of the display panel 100 in the first direction DR1 and a second gate driver 220 adjacent to another side of the display panel 100 in the first direction DR1. The first gate driver 210 is connected to odd-numbered gate lines, and the second gate driver 220 is connected to even-numbered gate lines.

The gate drivers 210 and 220 may be formed at the same time and in the same process as transistors of the pixels PX11 to PXmn. The gate drivers 210 and 220 may be, for example, amorphous silicon TFT gate driver circuits (ASG), an oxide silicon TFT gate driver circuit (OSG), or a poly silicon TFT gate driver circuit. For example, the gate drivers 210 and 220 may include a plurality of transistors. A semiconductor layer of each of the transistors of the gate drivers 210 and 220 may include amorphous silicon, oxide silicon, or polysilicon.

The gate drivers 210 and 220 receive a gate control signal from a timing controller mounted on or to the printed circuit board 400. The timing controller may be mounted on or to the printed circuit board 400 in the form of an IC chip and connected to the gate drivers 210 and 220 and the data drivers 300. The gate drivers 210 and 220 generate gate signals based on the gate control signal. The gate signals may be successively applied to the gate lines GL1 to GLm and then to the pixels PX.

The data driver 300 includes a plurality of source driving chips 310_1 to 310_k, where k is an integer greater than 0. The source driving chips 310_1 to 310_k are mounted on or to flexible circuit boards 320_1 to 320_k and connected to the printed circuit board 400 and the non-display area NDA adjacent to an upper portion of the display area DA. For example, the source driving chips 310_1 to 310_k may be connected to one side of the display panel 100 in a tape carrier package (TCP) manner in the second direction DR2. In one embodiment, the data driver 300 may be in a plurality of driving chips mounted on or to the display panel 100, for example, in a chip-on-glass (COG) manner.

The data driver 300 receives image signals and data control signals from the timing controller. The data driver 300 generates analog type data voltages corresponding to the image signals based on the data control signals. The data voltages are provided to the pixels PX through the data lines DL1 to DLn.

The pixels PX receives the data voltages through the data lines DL1 to DLn based on the gate signals received through the gate lines GL1 to GLm. The pixels PX emit light of gray scale values corresponding to the data voltages to form an image.

Figure 2:
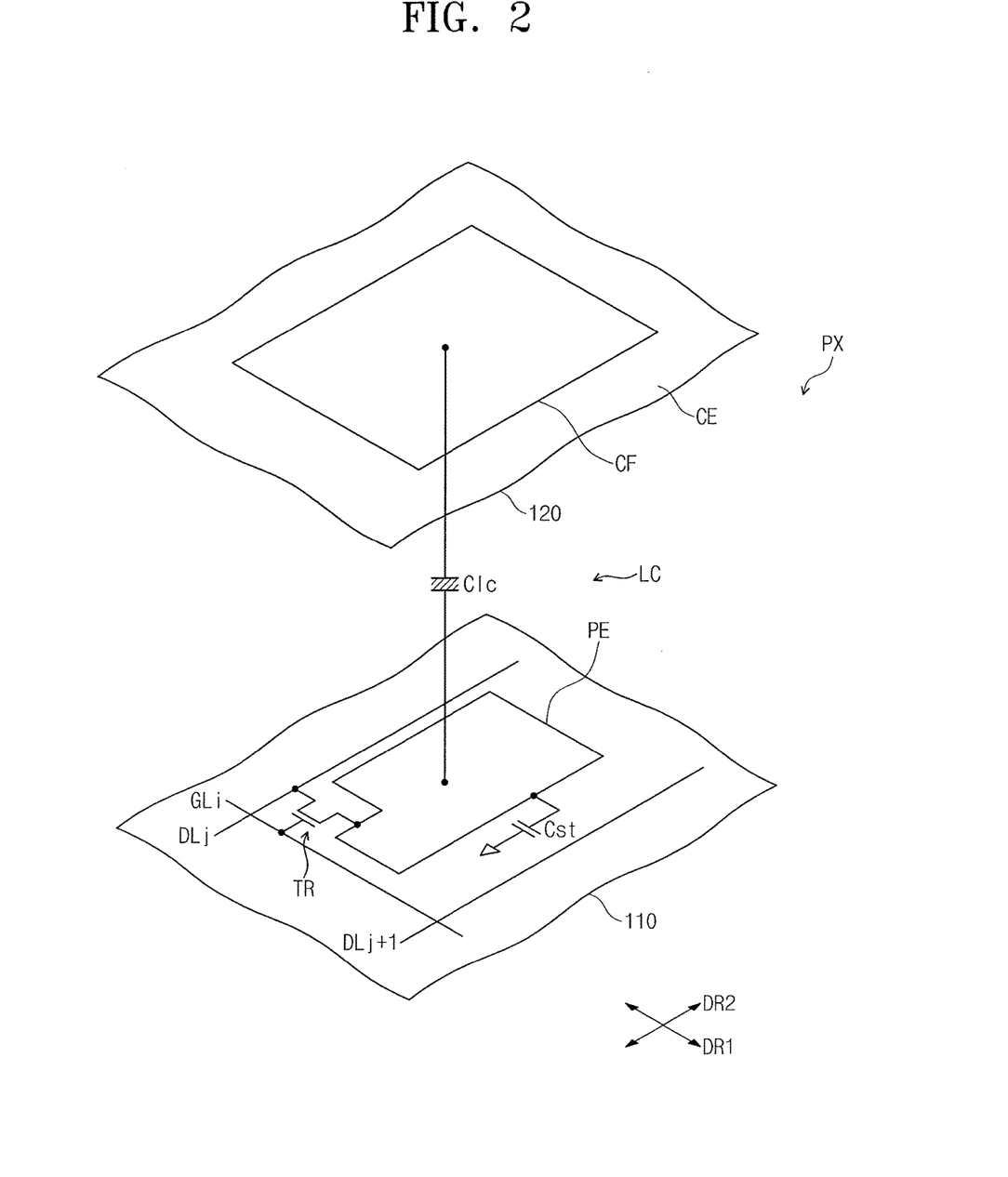
FIG. 2 illustrates an embodiment of a pixel.

FIG. 2 illustrates an embodiment of a pixel, which, for example, may be representative of the pixels PX in FIG. 1. Referring to FIG. 2, the display panel 110 includes a first substrate 110, a second substrate 120 facing the first substrate 110, and a liquid crystal layer LC between the first substrate 110 and the second substrate 120. The pixels PX in FIG. 1 are on the first substrate 110.

Each of the pixels PX is connected to a corresponding gate line GL1 of the gate lines GL1 to GLm, and includes a transistor TR connected to a corresponding data line DLj of the data lines DL1 to DLn, a liquid crystal capacitor Clc connected to the transistor TR, and a storage capacitor Cst connected parallel to the liquid crystal capacitor Clc. In one embodiment, the storage capacitor Cst may be omitted. Here, i is an integer greater than 0 and equal to or less than m, and j is an integer greater than 0 and equal to or less than n.

The gate line GLi, the data line DLj, and the transistor TR may be on the first substrate 110. The transistor TR includes a gate electrode connected to the gate line GLi, a source electrode connected to the data line DLj, and a drain electrode connected to the liquid crystal capacitor Clc and the storage capacitor Cst.

The liquid crystal capacitor Clc includes a pixel electrode PE on the first substrate 110, a common electrode CE on the second substrate 120 to face the pixel electrode PE, and a liquid crystal layer LC between the pixel electrode PE and the common electrode CE. The liquid crystal layer LC may serve as a dielectric. The pixel electrode PE is connected to the drain electrode of the transistor TR.

The pixel electrode PE has a non-slit structure in FIG. 2. In another embodiment, the pixel electrode PE may have a slit structure including, for example, a stem part having a cross shape and a plurality of branch parts radially extending from the stem part.

The common electrode CE may be over an entire surface of the second substrate 120. In another embodiment, the common electrode CE may be on the first substrate 110. In this case, at least one of the pixel electrode PE and the common electrode CE may have, for example, a slit structure.

The storage capacitor Cst may include the pixel electrode PE, a storage electrode branched from a storage line, and an insulation layer between the pixel electrode PE and the storage electrode. The storage line is on the first substrate 110. The storage line may be simultaneously formed together with the gate line GLi on the same layer. The storage electrode may partially overlap the pixel electrode PE.

The pixel may further include a color filter CF for representing one of red, green, and blue colors. As an exemplary embodiment, the color filter CF may be on the second substrate 120 as in FIG. 2. In another embodiment, the color filter CF may be on the first substrate 110.

The transistor TR is turned on based on s gate signal provided through the gate line GLi. A data voltage received through the data line DLj is provided to the pixel electrode PE of the liquid crystal capacitor Clc through the transistor TR that is turned on. A common voltage is applied to the common electrode CE.

Electric fields form between the pixel electrode PE and the common electrode CE based on a difference in voltage level between the data voltage and the common voltage. Liquid crystal molecules of the liquid crystal layer LC operate by the electric fields generated between the pixel electrode PE and the common electrode CE. Light transmittance may be adjusted by the liquid crystal molecules that operate based on the electric field to display an image.

A storage voltage having a uniform voltage level may be applied to the storage line. In one embodiment, the common voltage may be applied to the storage line. The storage capacitor Cst may supplement a voltage charged in liquid crystal capacitor Clc.

Figure 3:
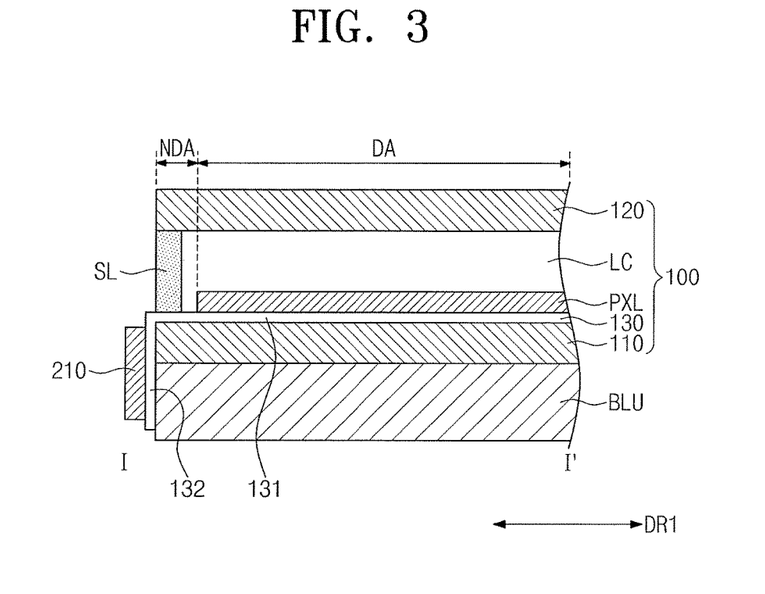
FIG. 3 illustrates a cross-sectional view taken along line I-I' in FIG. 1.
Figure 4:
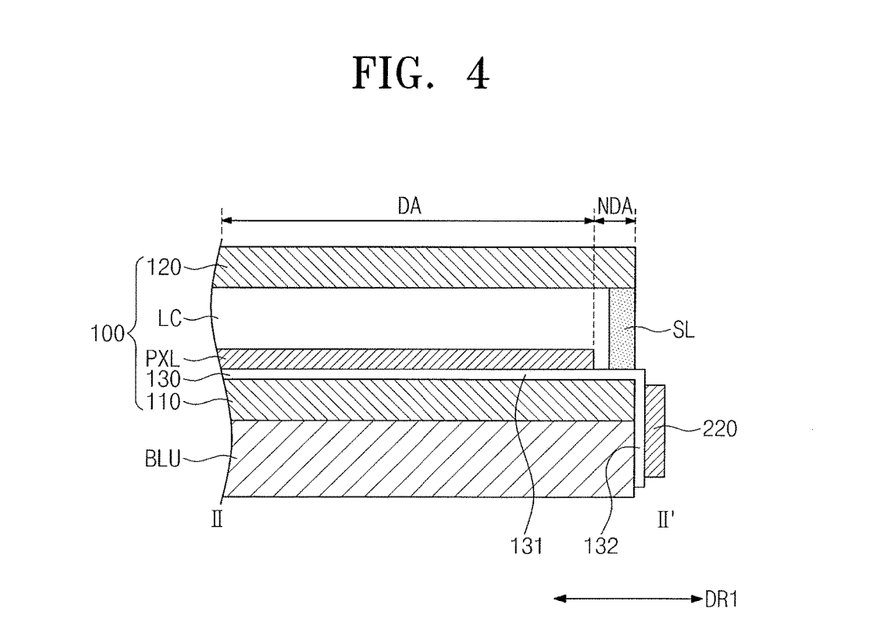
FIG. 4 illustrates a cross-sectional view taken along line II-II' in FIG. 1.
Figure 5:
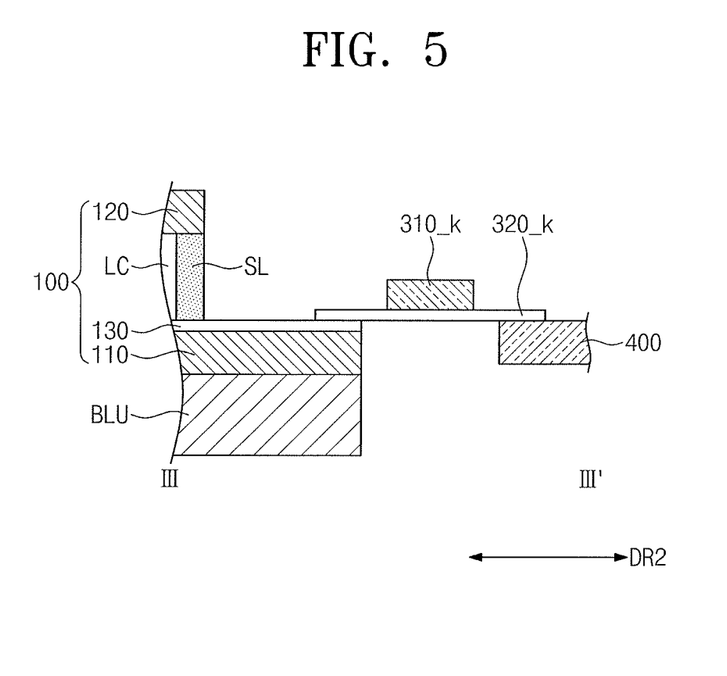
FIG. 5 illustrates a cross-sectional view taken along line in FIG. 1.

FIG. 3 illustrates a cross-sectional view taken along line I-I' of FIG. 1. FIG. 4 illustrates a cross-sectional view taken along line II-II' of FIG. 1. FIG. 5 illustrates a cross-sectional view taken along line III-III' of FIG. 1. For illustrative purposes, the common electrode CE and the color filter CF, which are on the second substrate 120, may be omitted in FIGS. 3 to 5. Also, the transistors TR and the pixel electrodes PE of the pixels PX, which are on the first substrate 110, may be illustrated in FIGS. 3 and 4 as a pixel layer PXL.

Referring to FIGS. 3, 4, and 5, the display apparatus 500 include a backlight unit BLU under the display panel 100. The backlight unit BLU generates light for the display panel 100. The pixels PX of the display panel 100 may adjust the transmittance of the light from the backlight unit BLU to display an image.

The backlight unit BLU may be attached to a lower portion of the display panel 100, for example, by an adhesion tape. The adhesion tape may be a light shielding tape for blocking light disposed on an area of the display panel 100 corresponding to the non-display area NDA.

The display panel 100 includes the first substrate 110, the second substrate 120, a dummy substrate 130, the pixel layer PXL, the liquid crystal layer LC, and a sealing member SL. As described above, the first substrate 110 and the second substrate 120 face each other, and the liquid crystal layer LC is between the first substrate 110 and the second substrate 120.

Each of the first substrate 110 and the second substrate 120 may be a substrate including glass. The first substrate 110 and the second substrate 120 may have the same length in the first direction DR1. The first substrate 110 and the dummy substrate 130 may have the same length in the second direction DR2, and the first substrate 110 may have a length greater than the second substrate 120 in the second direction DR2.

The dummy substrate 130 includes a first dummy substrate 131 on the first substrate 110 and a second dummy substrate 132 extending from the first dummy substrate 131 in the direction DR1 and bent downward. The second dummy substrate 132 is on different side surfaces of the first substrate in the first direction DR1. Also, the second dummy substrate 132 is on different side surface of the backlight unit BLU in the first direction DR1.

The first dummy substrate 131 overlaps a top surface of the first substrate 110, and the second dummy substrate 132 overlaps different side surfaces of the first substrate 110 and different side surfaces of the backlight unit BLU in the first direction DR1.

The second substrate 120 faces the first dummy substrate 132 on the first substrate 110. The liquid crystal layer LC is between the first dummy substrate 131 and the second substrate 120.

The dummy substrate 130 may be a flexible substrate having flexibility. For example, the dummy substrate 130 may include polyimide (PI), polycarbonate (PC), polynorborneen (PNB), polyethyleneterephthalate (PET), polyethylenapthanate (PEN), or polyethersulfone (PES), which has flexibility.

The pixels PX on the first substrate 110 are on the first dummy substrate 131. The first dummy substrate 131 and the second substrate 120 face each other with the pixels PX therebetween.

The gate lines GL1 to GLm, the data lines DL1 to DLn, the transistor TR, and the pixel electrodes PE are on the pixel layer PXL. The pixel layer PXL is on the first dummy substrate 131. The gate lines GL1 to GLm and the data lines DL1 to DLn are on substantially the same layer as transistors TR. Thus, the gate lines GL1 to GLm and the data lines DL1 to DLn are also on the first dummy substrate 131.

As described above in FIG. 2, the liquid crystal layer LC may be driven by the transistors TR and the pixel electrodes PE. Thus, the pixel layer PXL may be defined as a layer for driving the liquid crystal layer LC.

The first gate driver 210 is on the second dummy substrate 132 that is on one side surface of the first substrate 110 and one side surface of the backlight unit BLU in the first direction DR1. The second gate driver 220 is on the second dummy substrate 132 that is on the other surface of the first substrate 110 and the other surface of the backlight unit BLU in the first direction DR1.

As illustrated in FIG. 5, the source driving chip 310_k of the data driver 300 is connected to one side of the first dummy substrate 131 through the flexible circuit board 320_k in the second direction DR2. For example, the data driver 300 is connected to one side of the first dummy substrate 131 in the second direction DR2.

The sealing member SL is on a predetermined area of the non-display area NDA surrounding the display area DA. The sealing member SL is between the first dummy substrate 131 and the second substrate 120. The first dummy substrate 131 and the second substrate 120 may be bonded to each other to seal the liquid crystal layer LC.

The first and second gate drivers 210 and 220 are not on the non-display area NDA of the display panel 100, but may be on different side surfaces of display panel 100 on the plane. For example, an area on which the first and second gate drivers 210 and 220 are disposed is not required to be on the plane of the display panel 100. Thus, the size of the non-display area NDA of the display panel 100 may be reduced. As a result, the size of the bezel area corresponding to the non-display area NDA may be reduced.

Figure 6A:
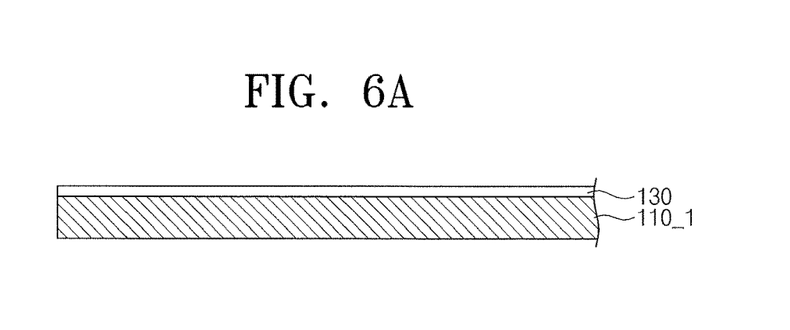
FIGS. 6A to 6F illustrate various stages in an embodiment of a method for manufacturing a display apparatus.
Figure 6B:
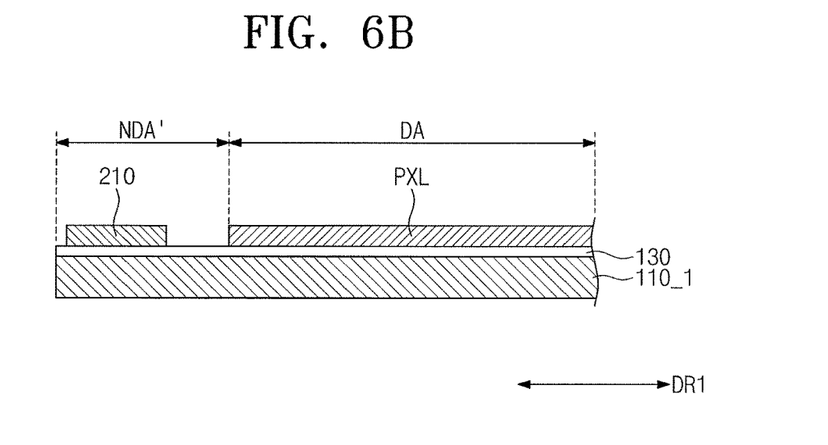
Figure 6C:
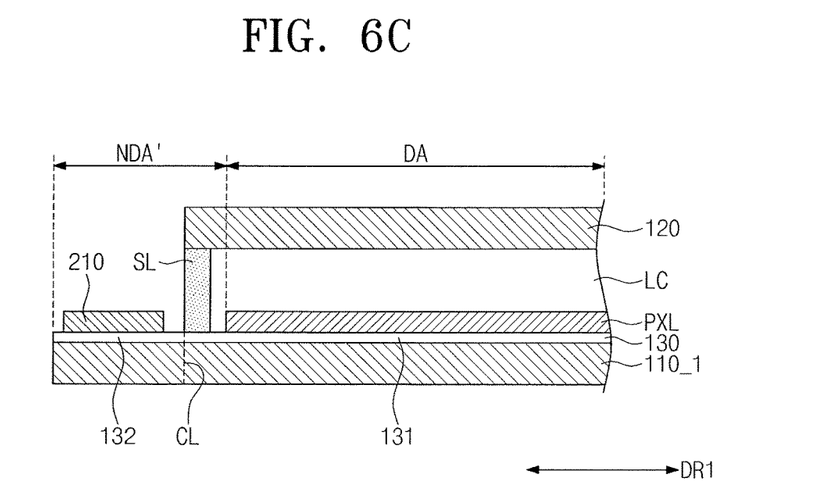
Figure 6D:
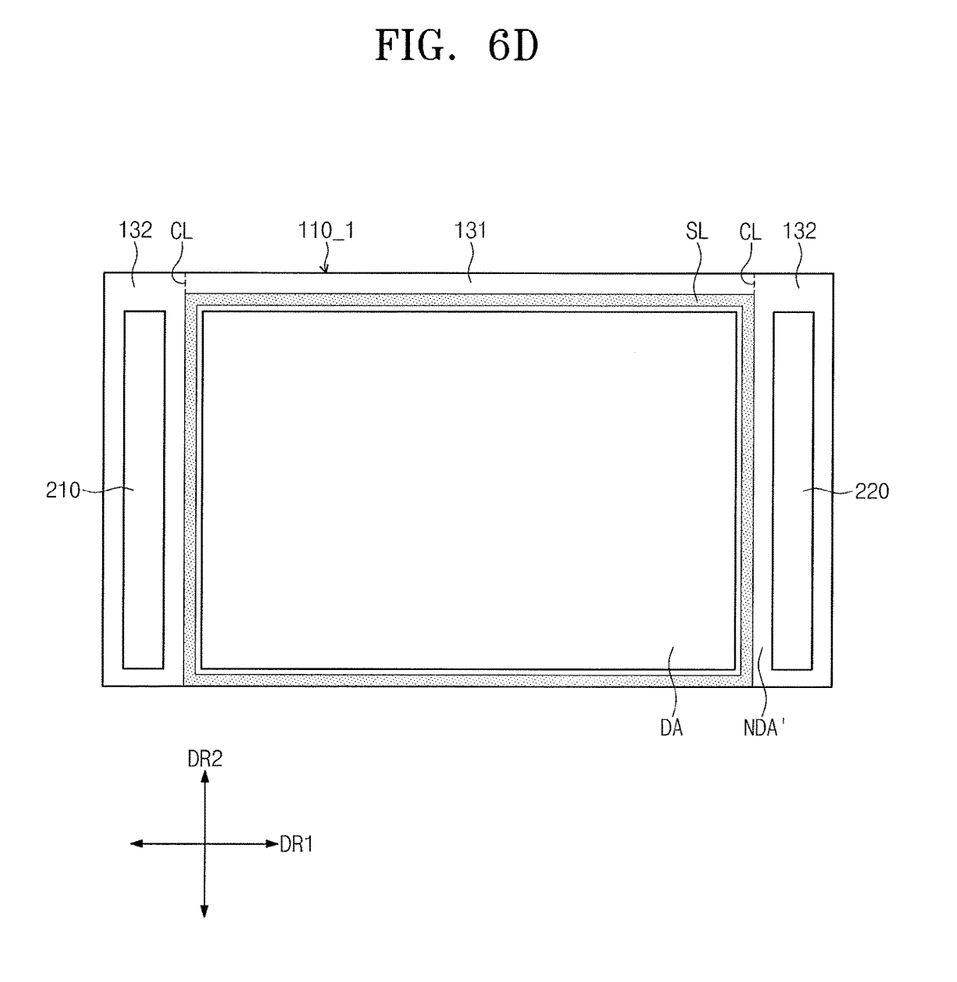

FIGS. 6A to 6F illustrates an embodiment of a method for manufacturing a display apparatus, which, for example, may be a display apparatus in accordance with any of the embodiments disclosed herein. For convenience of description, FIGS. 6A to 6C, 6E, and 6F are illustrated as views corresponding to the cross-sectional view taken along line I-I' of FIG. 3. Also, for convenience of description, the sealing member SL disposed on a first substrate 110_1 and the dummy substrate 130 and the first and second gate drivers 210 and 220 are illustrated in FIG. 6D.

The cross-sections in FIGS. 6A to 6C, 6E, and 6F illustrate an area of the display device 500 on which the first gate driver 210 is disposed. Since the second gate driver 220 is symmetrical to the first gate driver 210, the second gate driver 220 will be briefly described without being illustrated in the manufacturing method of FIGS. 6A to 6C, 6E, and 6F.

Referring to FIG. 6, the first substrate 110_1 is prepared and the dummy substrate 130 having flexibility is disposed on the first substrate 110_1. The first substrate 110_1 is greater than the first substrate 110 of the display panel 100 in the first direction DR1. The dummy substrate 130 may overlap the first substrate 110_1.

Referring to FIG. 6B, the pixel layer PXL and the first gate driver 210 are on the dummy substrate 130. The second gate driver 220 is also on the dummy substrate 130.

An area of the first substrate 110_1 and the dummy substrate 130 on the plane include the display area DA and a non-display area NDA' surrounding the display area DA. The display area DA may be the same area as the display area DA of the display panel 100. The non-display area NDA' is as an area including the non-display area NDA of the display panel 100 and the first substrate 110_1 and the dummy substrate 130 on which the first and second gate drivers 210 and 220 are disposed on the plane.

The pixel layer PXL is an the display area DA, and the first gate driver 210 is on a predetermined area of the non-display area NDA', which is adjacent to one side of the display area DA in the first direction DR1. Also, the first gate driver 210 may be spaced apart from the pixel layer PXL and adjacent to one side of the dummy substrate 130 in the first direction DR1.

The second gate driver 220 is on a predetermined area of the non-display area NDA', which is adjacent to the other side of the display area DA in the first direction DR1. Also, the second gate driver 220 may be spaced apart from the pixel layer PXL and adjacent to the other side of the dummy substrate 130 in the first direction DR1.

The first and second gate drivers 210 and 220 may be formed at the same time and in the same process as the transistors TR of the pixel layer PXL. The first and second gate drivers 210 and 220 may be, for example, amorphous silicon TFT gate driver circuits (ASG) or oxide semiconductor TFT gate driver circuits (OSG) on the dummy substrate 130. The source driving chips 310_1 to 310_k of the data driver 300 may be connected to one side of the dummy substrate 130 through the flexible circuit boards 320_1 to 320_k in the second direction DR2.

Referring to FIGS. 6C and 6D, the dummy substrate 130 includes a first dummy substrate 131 and a second dummy substrate 132 on different or respective sides of the first dummy substrate to extend from the first dummy substrate 131 in the first direction DR1. A predetermined area of each of the sides of the first dummy substrate 131 overlaps the non-display area NDA'. The pixel layer PXL is on the first dummy substrate 131 and the first and second gate drivers 210 and 220 are on the second dummy substrate 132. The second substrate 120 faces the first dummy substrate, and the liquid crystal layer LC is between the first dummy substrate 131 and the second substrate 120.

The sealing member SL is on a predetermined area of non-display area NDA' and surrounds the pixel layer PXL on the display area DA. The sealing member SL is on the first dummy substrate 131 and adjacent to a boundary between the first dummy substrate 131 and the second dummy substrate 131 and a side surface of the second substrate 120 in the first direction DR1. The sealing member SL is between the first dummy substrate 131 and the second substrate 120 to bond the first dummy substrate 131 to the second substrate 120. The liquid crystal layer LC thus may be sealed.

A virtual line extending in the second direction DR2 to overlap the boundary between the first dummy substrate 131 and the second dummy substrate 132 may be a cutting line CL. The cutting line CL may be a cutting line of the first substrate 110_1.

Figure 6E:
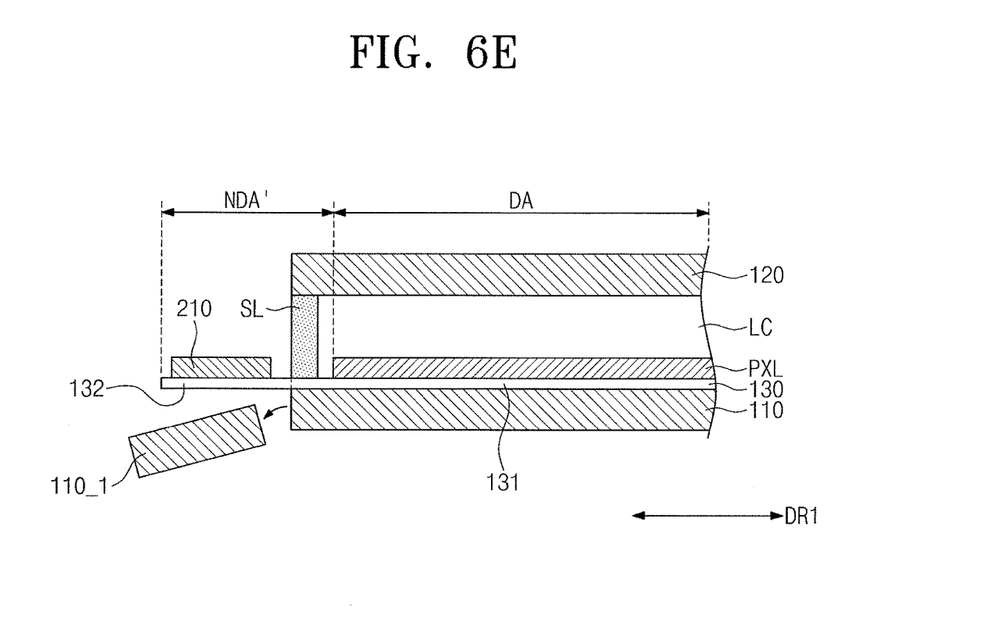

Referring to FIG. 6E, the first substrate 110_1 is cut along the cutting line CL. Various methods for cutting the first substrate 110_1 along the cutting line CL may be used. For example, the first substrate 110_1 may be cut along the cutting line CL by using a diamond wheel or a laser. The first substrate 110_1 is cut along the cutting line CL. Thus, the first substrate 110_1 on the lower portion of the second dummy substrate 132 is removed from the second dummy substrate 132. The remaining portion of the first substrate 110_1 is used as the first substrate 110 of the display panel 100.

Figure 6F:
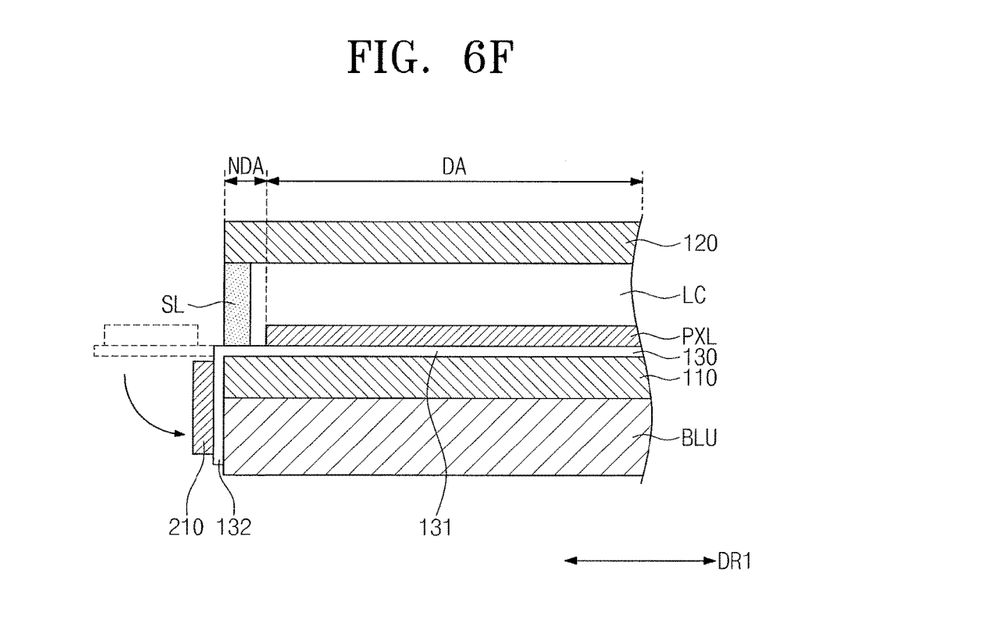

Referring to FIG. 6F, the backlight unit BLU is under the first substrate 110. The second dummy substrate 132 of the dummy substrate 130 is bent and disposed on different or respective side surfaces of the first substrate 110 in the first direction DR1 and on different or respective side surfaces of the backlight unit BLU in the first direction DR1.

Thus, the first gate driver 210 is on the second dummy substrate 132 that is on one side surface of the first substrate 110 and one side surface of the backlight unit BLU in the first direction DR1. The second gate driver 220 is on the second dummy substrate 132 that is disposed on the other surface of the first substrate 110 and the other surface of the backlight unit BLU in the first direction DR1.

As a result, in the method for manufacturing the display apparatus according to an embodiment, the second dummy substrate 132 on which the first and second gate drivers 210 and 220 are disposed may be bent and disposed on different side surfaces of the display panel 100 to reduce the bezel area.

Figure 7:
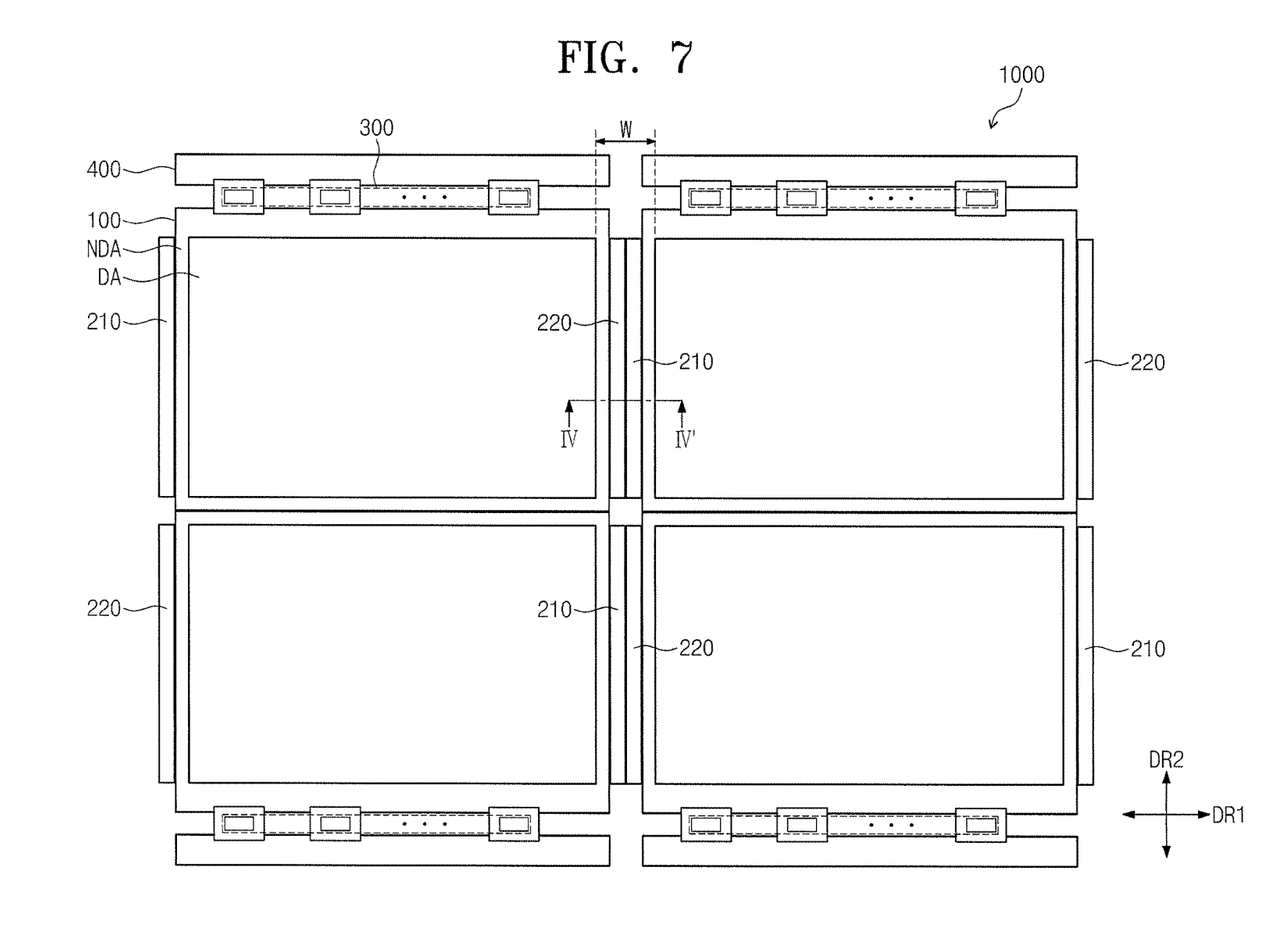
FIG. 7 illustrates an embodiment of a multi display apparatus.

FIG. 7 illustrates an embodiment of a multi display apparatus. 1000 which includes a plurality of display panels 100 arranged in the form of a matrix, a plurality of gate drivers 210 and 220 adjacent to different side surfaces of the display panels 100 in the first direction DR1, a plurality of data drivers 300 connected to one side of each of the display panels 100 in the second direction DR2, and a plurality of printed circuit boards 400 connected to the data drivers 300. The multi display apparatus 1000 may be one with the display panels 100 connected to each other to display an image.

The display panels 100, the gate drivers 210 and 220, the data drivers 300, and the printed circuit boards 400 in FIG. 7 may have, for example, the same constitutions as the display panel 100, the gate driver 210 and 220, the data driver 300, and the printed circuit board 400 of the display apparatus 100 in FIG. 1.

The display panels 100 may be arranged in the form of an N×N matrix, e.g., N 2. Each of the display panels 100 has a long side in the first direction DR1 and a short side in the second direction DR2. In one embodiment, the display panels 100 may be arranged in the form of an N×M matrix, where N≥1 and M≥2.

First and gate drivers 210 and 220 of the gate drivers 210 and 220 are, respectively, on different sides of each of the display panels 100 in the first direction DR1. A data driver 300 of the data drivers 300 is connected to one side of each of the display panel 100 in the second direction DR2.

The first and second gate drivers 210 and 220 between the side surfaces of the first substrates 110 of the display panels 100, which face each other in the first direction DR1, may contact each other. The side surfaces of the display panels 100 on which the data driver 300 is not disposed in the second direction DR1 may contact each other.

The first and second gate drivers 210 and 220 are not disposed on the non-display area NDA of the display panel 100, but are on different side surfaces of the display panel 100 on the plane to reduce the non-display area of the display panel 100.

Each of the first and second drivers 210 and 220 may have a width of about 8 mm on the plane. When the first and second gate drivers 210 and 220 are on the non-display area NDA of the display panel 100 on the plane, the sum of the widths of the non-display areas between the display areas DA of the display panels 100 adjacent to each other in the first direction DR1 may be greater than a predetermined value, e.g., about 16 mm.

In one embodiment, since the first and second gate drivers 210 and 220 are on different side surfaces of the display panel 100, the width of an area between the display areas DA adjacent to each other in the first direction DR1 may be in a predetermined range, e.g., from and 0.4 mm to about 1.0 mm.

An area between the display panels DA adjacent to each other in the first direction DR1 includes the non-display areas NDA between the display areas DA adjacent to each other in the first direction DR1 and the area between the display panels 100 in the first direction DR1. The area between the display panels 100 may correspond to the bezel area.

In the embodiment, since the first and second gate drivers 210 and 220 are on different side surfaces of the display panel 100, the area between the display areas DA adjacent to each other in the first direction DR1 may be reduced in width. As a result, in the display apparatus 1000 according to an embodiment, the bezel area may be reduced.

Figure 8:
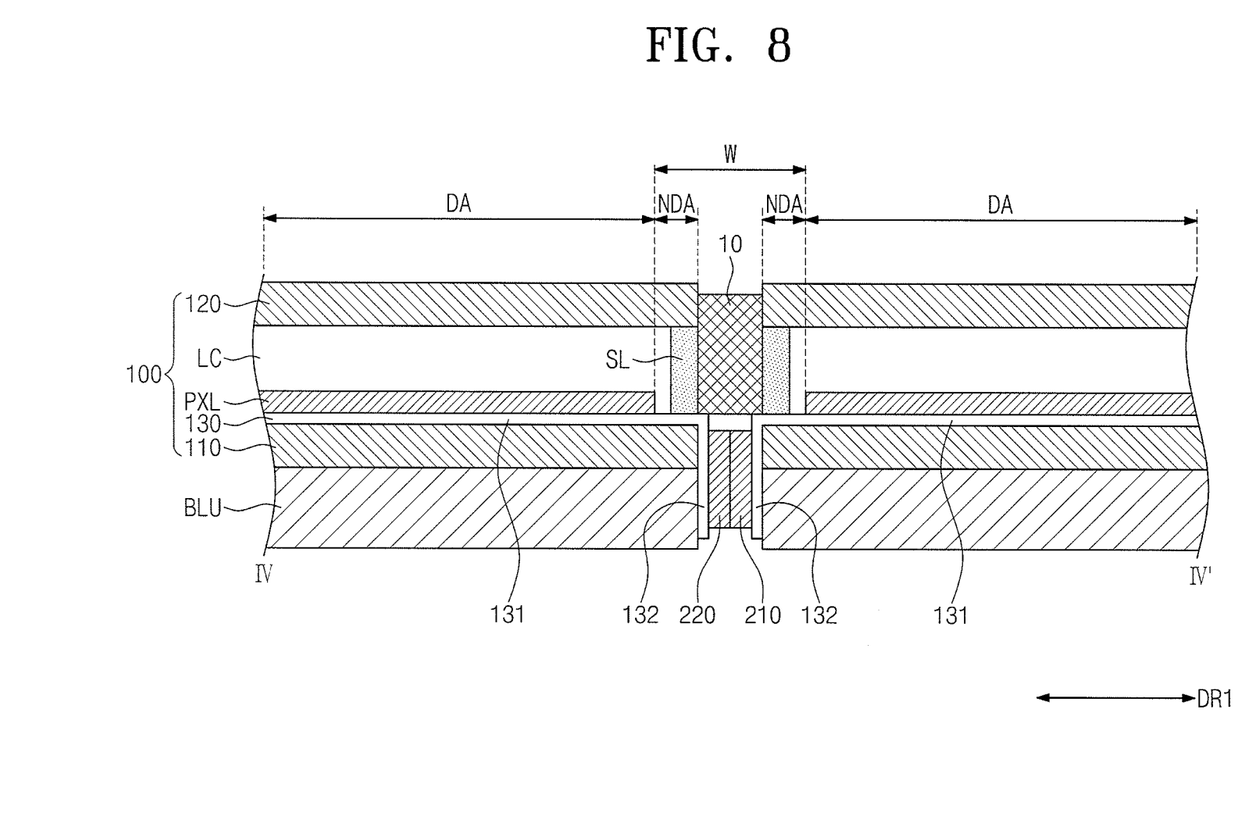
FIG. 8 illustrates a cross-sectional view taken along line IV-IV' in FIG. 7.

FIG. 8 illustrates a cross-sectional view taken along line IV-IV' in FIG. 7. Referring to FIG. 8, the multi display apparatus 1000 further includes a buffer member 10 between the display panels 100 adjacent to each other in the first direction DR1. For example, the buffer member may be between the sealing members SL of the display panels 100 adjacent to each other in the first direction DR1 and between the second substrates 120.

The buffer member 10 is above the first and second gate drivers 210 and 220. The buffer member 10 may be formed of a material having elasticity. For example, the buffer member 10 may include foam rubber or Styrofoam having buffering force. In one embodiment, a resin may be used as the buffer member 10. The buffer member 10 may prevent the display panels 100 adjacent to each other from being damaged by bumping against each other or other impact.

Figure 9:
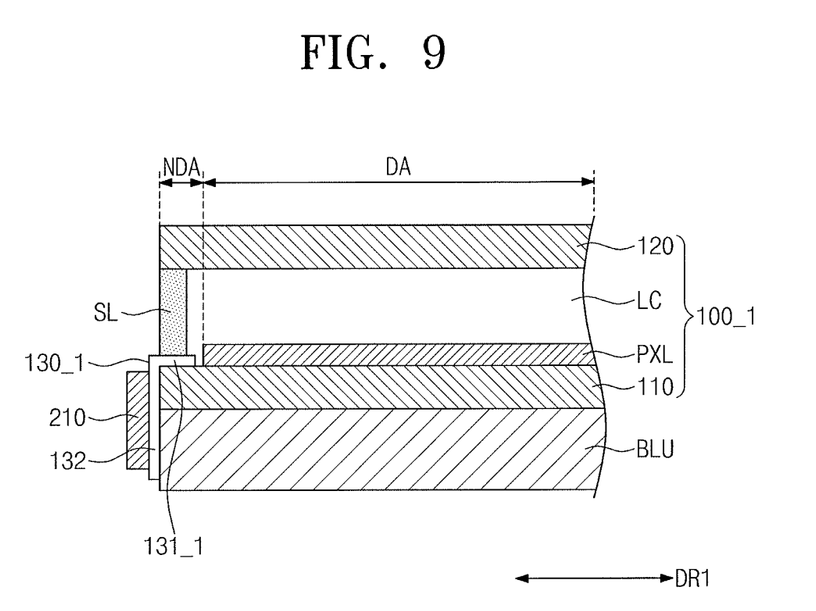
FIG. 9 illustrates an embodiment of a display panel.

FIG. 9 illustrates another embodiment of a display panel. For convenience of description, FIG. 9 illustrates a view corresponding to the cross-sectional view taken along lien I-I' of FIG. 3. The display apparatus may have the same constituent elements as the display apparatus 500 in FIG. 1, except for a third substrate 130_1 of the display panel 100_1.

Referring to FIG. 9, a pixel layer PXL is on a first substrate 110 of a display area DA. A dummy substrate 130_1 includes a first dummy substrate 131_1 on the first substrate 110 on a predetermined area of a non-display area NDA and a second dummy substrate 132 extending from the first dummy substrate 131_1 in the direction DR1 and bent downward. In this case, a data driver 300 is connected to one side of the first substrate 110 in the second direction DR2.

The second dummy substrate 132 is on different side surfaces of the first substrate 110 in the first direction DR1 and different side surfaces of a backlight unit BLU in the first direction DR1. The dummy substrate 130_1 may be a flexible substrate having flexibility.

A first gate driver 210 is on the second dummy substrate 132 that is on one side surface of the first substrate 110 and one side surface of the backlight unit BLU in the first direction DR1. A second gate driver 220 is on the second dummy substrate 132 that is on another surface of the first substrate 110 and another surface of the backlight unit BLU in the first direction DR1.

The gate drivers 210 and 220 are not on the non-display area NDA of the display panel 100, but are on different side surfaces of the display panel 100 on the plane to reduce the non-display area of the display panel 100_1.

As a result, a bezel area may be reduced. In the display apparatus, the method for manufacturing the same, and the multi display apparatus according to the embodiment, the portion of the dummy substrate on which the gate driver is disposed may be bent and on the side surface of the display panel to reduce the bezel area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display apparatus, comprising:
a first substrate;
a backlight under the first substrate;
a first dummy substrate on the first substrate;
a second dummy substrate extending from two opposite end sides of the first dummy substrate and bent perpendicular to the two opposite end sides of the first dummy substrate in a first direction;
a plurality of pixels on the first dummy substrate; and
a gate driver on the second dummy substrate and connected to the pixels,
wherein the gate driver and the second dummy substrate are disposed on at least one side end surface of two opposite side end surfaces of the first substrate in the first direction and at least one side end surface of two opposite side end surfaces of the backlight in the first direction such that the second dummy substrate contacts the at least one side end surface of the two opposite side end surfaces of the first substrate and the at least one side end surface of the two opposite side end surfaces of the backlight.

2. The display apparatus as claimed in claim 1, wherein each of the first and second dummy substrates includes a flexible substrate.

3. The display apparatus as claimed in claim 1, wherein the first substrate is a glass substrate.

4. The display apparatus as claimed in claim 1, further comprising:
a data driver connected to one side of the first dummy substrate in a second direction crossing the first direction and connected to the pixels.

5. The display apparatus as claimed in claim 4, further comprising:
a plurality of gate lines on the first dummy substrate, extending in the first direction, and connected to the pixels and the gate driver; and
a plurality of data lines on the first dummy substrate, extending in the second direction, and connected to the pixels and the data driver.

6. The display apparatus as claimed in claim 5, wherein the gate driver includes:
a first gate driver connected to odd-numbered gate lines of the gate lines; and
a second gate driver connected to even-numbered gate lines of the gate lines.

7. The display apparatus as claimed in claim 6, wherein:
the first gate driver is on the second dummy substrate disposed on one side surface of the first substrate and one side surface of the backlight in the first direction, and
the second gate driver is on the second dummy substrate disposed on another side surface of the first substrate and another side surface of the backlight in the first direction.

8. The display apparatus as claimed in claim 1, wherein an area of a plane of the first substrate includes:
a display area including the pixels; and
a non-display area adjacent to the display area.

9. The display apparatus as claimed in claim 8, further comprising:
a second substrate facing the first dummy substrate with the pixels therebetween.

10. The display apparatus as claimed in claim 9, further comprising:
a seal on a predetermined area of the non-display area and adjacent to the display area, wherein the seal is between the first dummy substrate and the second substrate and bonds the first dummy substrate to the second substrate.

11. The display apparatus as claimed in claim 1, wherein:
the gate driver includes an amorphous silicon thin film transistor gate driving circuit, an oxide silicon thin film transistor gate driving circuit, or a polysilicon thin film transistor gate driving circuit.

12. A method for manufacturing a display apparatus, the method comprising:
providing a dummy substrate including a first dummy substrate and a second dummy substrate extending from two opposite end sides of the first dummy substrate on a first substrate;
providing a pixel layer on the first dummy substrate and a gate driver connected to the pixel layer on the second dummy substrate;
connecting a data driver, connected to the pixel layer, to one side of the first substrate in a second direction crossing a first direction;
providing a second substrate to face the first dummy substrate with the pixel layer therebetween;
providing an image display layer between the dummy substrate and the second substrate;
separating the first substrate along a line which overlaps a boundary between the first dummy substrate and the second dummy substrate to extend in the second direction;
removing the first substrate on a lower portion of the second dummy substrate;
providing a backlight to generate light below the first substrate; and
bending the second dummy substrate perpendicular to the two opposite end sides of the first dummy substrate in the first direction to provide the second dummy substrate on different side surfaces of the first substrate in the first direction,
wherein the gate driver and the second dummy substrate are disposed on at least one side end surface of two opposite side end surfaces of the first substrate and the backlight in the first direction such that the second dummy substrate contacts at least one side end surface of the two opposite side end surfaces of the first substrate and the backlight.

13. The method as claimed in claim 12, further comprising:
providing a seal on the first dummy substrate adjacent to the pixel layer, the seal adjacent to the boundary between the first dummy substrate and the second dummy substrate and a side surface of the second substrate in the first direction; and
bonding the first dummy substrate to the second substrate using the sealing.

14. The method as claimed in claim 12, wherein:
the image display layer includes a liquid crystal layer,
each of the first and the second substrates includes a glass substrate, and
the dummy substrate includes a flexible substrate.

15. The method as claimed in claim 12, further comprising:
wherein the second dummy substrate is on different side surfaces of the first substrate in the first direction and on different side surfaces of the backlight in the first direction.

16. A multi display apparatus, comprising:
a plurality of display panels arranged in a matrix form;
a plurality of gate drivers adjacent to different side surfaces of the display panels in a first direction;
a plurality of data drivers connected to one side of each of the display panels in a second direction crossing the first direction; and
a buffer between the display panels which are adjacent to each other in the first direction, wherein each of the display panels includes:
a first substrate;
a backlight under the first substrate;
a first dummy substrate on the first substrate;
a second dummy substrate extending from two opposite end sides of the first dummy substrate and bent perpendicular to the two opposite end sides of the first dummy substrate in the first direction;
a plurality of pixels on the first dummy substrate; and
a second substrate facing the first dummy substrate with the pixels therebetween, wherein
the gate driver is on the second dummy substrate and connected to the pixels,
the data driver is connected to one side of the first dummy substrate in the second direction and connected to the pixels, and
the gate driver and the second dummy substrate are disposed on at least one side end surface of two opposite side end surfaces of the first substrate in the first direction and at least one side end surface of two opposite side end surfaces of the backlight in the first direction such that the second dummy substrate contacts the at least one side end surface of the two opposite side end surfaces of the first substrate and the at least one side end surface of the two opposite side end surfaces of the backlight.

17. The multi display apparatus as claimed in claim 16, wherein:
the display panels are arranged in a N×M matrix form, where N≥1 and M≥2;
the gate drivers between side surfaces of the first substrate of the display panels facing each other in the first direction contact each other,
side surfaces of the display panels on which the data drivers are not disposed in the second direction contact each other, and
the buffer is above the gate drivers.

18. The multi display apparatus as claimed in claim 16, wherein an area of a plane of the display panel includes:
a display area including the pixels; and
a non-display area adjacent to the display area,
wherein an area between the display areas adjacent to each other in the first direction has a width of about 0.4 mm to about 1.0 mm.

* * * * *